United States Patent [19]
Rector et al.

[11] Patent Number: 6,115,676
[45] Date of Patent: Sep. 5, 2000

[54] METHODS AND APPARATUS FOR PERFORMING LOAD PROFILE AND LOAD CONTROL

[75] Inventors: William O. Rector, Dover; Ginger Zinkowski, East Kingston; Larry Schmidt, Rochester; Marjorie J. Mancuso, Stratham, all of N.H.

[73] Assignee: General Electric Company, Schenectady, N.Y.

[21] Appl. No.: 08/630,094

[22] Filed: Apr. 9, 1996

[51] Int. Cl.[7] .............................. G01R 11/00; H04Q 1/00
[52] U.S. Cl. .............................. 702/62; 702/61; 705/412; 340/870.02; 340/825.16; 324/140 R; 324/141; 324/142; 324/103 R; 324/113
[58] Field of Search .................... 364/492, 923, 364/923.2, 483, 464.22; 324/103 R, 113, 116, 142, 140 D, 140 R, 141; 340/870.02, 663, 870.03; 361/88, 92; 705/412; 702/61, 62, 64

[56] References Cited

U.S. PATENT DOCUMENTS

| | | |
|---|---|---|
| 4,152,605 | 5/1979 | Conde et al. . |
| 4,213,119 | 7/1980 | Ward et al. . |
| 4,264,897 | 4/1981 | Farnsworth . |
| 4,315,248 | 2/1982 | Ward . |
| 4,400,783 | 8/1983 | Locke, Jr. et al. ...................... 364/483 |
| 4,465,970 | 8/1984 | DiMassimo et al. . |
| 4,466,074 | 8/1984 | Jindrick et al. ......................... 364/569 |
| 4,511,979 | 4/1985 | Amirante . |
| 4,571,692 | 2/1986 | Germer . |
| 4,594,545 | 6/1986 | Germer ................................ 324/103 R |
| 4,881,070 | 11/1989 | Burrowes et al. .................. 340/870.02 |
| 4,999,572 | 3/1991 | Bickford et al. .................... 342/103 R |
| 5,079,715 | 1/1992 | Venkataraman et al. ............... 364/481 |
| 5,148,101 | 9/1992 | Balch et al. . |
| 5,311,068 | 5/1994 | Miller . |
| 5,315,235 | 5/1994 | Atherton et al. ........................ 324/116 |
| 5,448,229 | 9/1995 | Lee, Jr. ............................... 340/870.02 |
| 5,459,459 | 10/1995 | Lee, Jr. . |
| 5,462,225 | 10/1995 | Massara et al. . |
| 5,477,216 | 12/1995 | Lee, Jr. et al. ...................... 340/870.02 |
| 5,495,239 | 2/1996 | Ouellette . |
| 5,525,898 | 6/1996 | Lee, Jr. et al. .......................... 324/142 |
| 5,546,318 | 8/1996 | Lee, Jr. .................................. 364/483 |
| 5,576,700 | 11/1996 | Davis et al. ........................ 340/825.16 |

Primary Examiner—Tariq R. Hafiz
Assistant Examiner—Tuan Q. Dam
Attorney, Agent, or Firm—Armstrong Teasdale LLP

[57] ABSTRACT

An electronic energy meter register which, in one aspect, is configured to perform load profile recording in a manner which eliminates a need for a back-up battery is described. In other aspects, the present invention is a routine of operating a meter register for providing a cost savings and/or productivity gain when a utility customer relocates and for ensuring that load control commands are effectively executed. The register, in one embodiment, is configured to be coupled to a meter including an eddy current disk and shaft which rotate in response to the rate of energy consumption by a load being metered. The register, in the one embodiment, includes a microprocessor, a non-volatile memory, and a disk sensing optics assembly.

23 Claims, 3 Drawing Sheets

METHODS AND APPARATUS FOR PERFORMING LOAD PROFILE AND LOAD CONTROL

FIELD OF THE INVENTION

This invention relates generally to electricity metering and more particularly, to an electronic register for use in connection with an electricity meter.

BACKGROUND OF THE INVENTION

An electromechanical watthour meter including an electronic register typically utilizes an eddy current disk which rotates in response to the rate of energy consumption by a load being metered. A shutter is commonly mounted on the same shaft as the eddy current disk, and the shutter is positioned to rotate between a light emitter and a light detector pair. A plurality of circumferential teeth on the rotating shutter sequentially break the light beam between the light emitter and light detector pair to provide a series of electrical pulses, the frequency of which is directly proportional to the rate of energy consumption by the load being metered. The pulses are supplied to the electronic register and, using the pulse data, the electronic register generates well known energy consumption measurements. An example of an electronic demand register is described in U.S. Pat. No. 4,571,692, which is assigned to the present assignee.

Electronic registers are particularly well suited for generating load profile type consumption measurements. To perform load profile operations, the register typically is programmed to store the consumption data, e.g., pulses, in pre-set intervals, e.g., 5, 15, 30 or 60 minute intervals. Since the intervals typically are synchronized around hour boundaries, a real time clock is required. The data for each interval is loaded into a separate register memory location, and then the data is retrieved from the register memory by the utility for billing purposes.

To ensure accurate billing, it is important that the integrity of the load profile data in the electronic register be maintained, even during a power outage. Since the electronic register typically is energized from the power distribution lines supplying energy to the load being metered, if power to the load is lost, the register is deenergized. To prevent loss of the load profile data during a power outage, and upon detection of a power outage, the data is loaded into a non-volatile memory. A back-up battery is supplied with the register and energizes the register microprocessor to enable the register microprocessor to perform the time keeping function during the outage. Since accurate load profile measurements rely upon accurate interval recording, the time of day must be available to the register upon restoration of power after the outage.

The batteries used in electronic registers typically are expensive and add to both the initial cost and maintenance cost of the register. Further, at the end of the battery life, the register battery must be properly discarded to minimize any environmental hazards.

In addition to load profile measurements, other functions performed by electronic registers include communicating metering data and commands between the register and a control station. Examples of such systems are set forth in U.S. Pat. Nos 5,495,239 and 5,459,459, both of which are assigned to the present assignee. Including communications components in a register, of course, adds to the register cost. Such costs may be offset, however, by using such communication capability to provide cost savings and/or productivity gains.

It would be desirable to eliminate the battery used in known electronic registers without sacrificing load profile metering data integrity. It also would be desirable to utilize the communications capability in electronic registers to provide additional cost savings and productivity gains for utilities and others.

SUMMARY OF THE INVENTION

These and other objects may be attained in an electronic energy meter register which, in one aspect, is configured to perform load profile recording in a manner which eliminates a need for a back-up battery. More specifically, and in accordance with one embodiment, a meter register microprocessor is programmed to initialize a load profile interval timer to a load profile interval length and record load profile data in the register non-volatile memory. If the register loses power, then the register microprocessor ends a load profile interval in progress, sets an outage bit, records interval pulse data for the interval in progress in the non-volatile memory, and records the time and date of the power outage in a history log. Upon power restoration after an outage, the register microprocessor initializes the register timer, initiates load profile recording, receives a time broadcast from the service control center, and upon receipt of a first time broadcast from the service control center after power up, forces the load profile interval in progress to end on a synchronized boundary. The register microprocessor also determines the time of power restoration and marks intervals that would have occurred during the power outage as zero pulse intervals. The above described routine provides the advantages of eliminating the battery used in known electronic registers without sacrificing load profile metering data integrity.

In another aspect, the present invention is a routine of operating a meter register for providing a cost savings and/or productivity gain when a utility customer relocates. More specifically, the routine includes the steps of transmitting metering "last read" data from the register memory to the service control center, and then remotely (e.g., via the communications network) setting a demand threshold. The meter then monitors the service by comparing energy consumed by the load with the threshold and transmitting a message to the service control center if the energy consumed exceeds the threshold. The utility may then elect to disconnect the service. This routine enables a utility to predetermine an energy consumption amount, i.e., the threshold, that it is willing to absorb after a customer has moved out and prior to a new customer moving into a location being metered. If the threshold is exceeded, the utility may, for example, want to disconnect the service rather than absorb the energy consumption costs.

In another aspect, the present invention is a routine of operating a meter register for providing a cost savings and/or productivity gain by ensuring that load control commands are effectively executed. More specifically, the register is configured to normally operate so that at the end of every minute, a snap-shot of the pulses collected in the previous minute is taken and stored in a queue for subsequent processing. As an aid in evaluating the effect of load control commands and to detect load control tampering, when a load profile snapshot command is received by the register, the register saves the kilowatthour pulses for the minute before, minute during and minute after the command was received. The accumulated pulse data is then transmitted by the register to the service control center. When the load profile snapshot command is sent concurrently with a load control command, the cumulative effect of the load control actions can be evaluated. By tracking the effect at individual meters over a period of time, load control tampering also can be detected. In this manner, the above described routine provides a cost savings and/or productivity gains for the utility.

DETAILED DESCRIPTION OF THE DRAWINGS

Figure 1:
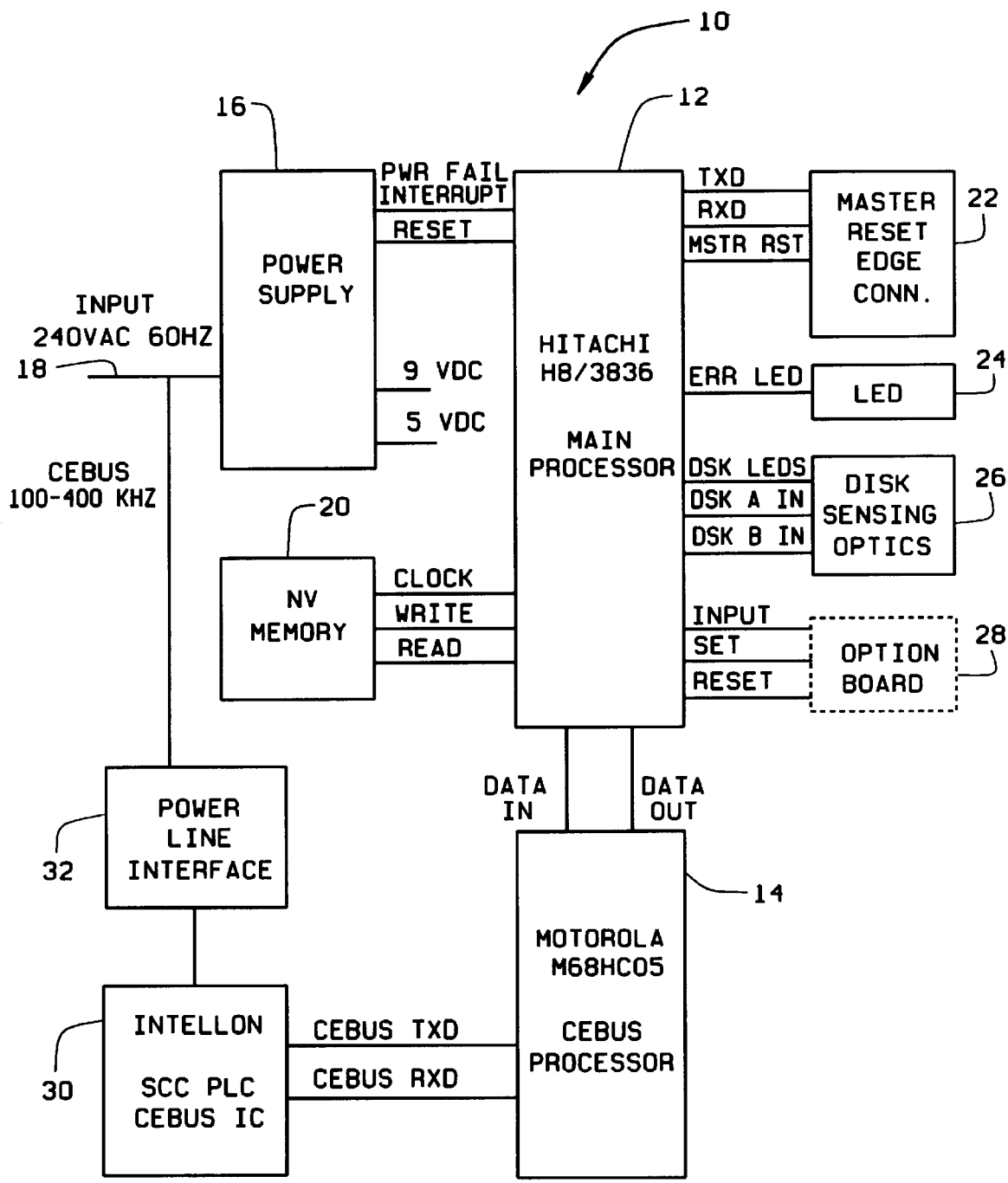
FIG. 1 is a block diagram of an electronic energy meter register in accordance with one embodiment of the present invention.

FIG. 1 is a block diagram of a communicating, electronic energy meter register 10. Register 10 is illustrated and described herein to illustrate one example of a register in which embodiments of the present invention can be implemented. The embodiments of the present invention are not limited, however, to practice in connection with register 10 and it is contemplated that such embodiments can be incorporated into and used in connection with many other communicating registers. Further, the present invention is not directed to the architecture of register 10 and the many register functions other than the load profile power outage, load profile snapshot and alarm routines described hereinbelow in more detail.

Register 10 performs metering, control, monitoring and communication functions. Register 10 may, for example, be mounted on a GE Type I-70S meter (not shown), available from GE Meter, 130 Main Street, Somersworth, N. H. 03878, and secured to the meter frame using the nameplate mounting posts. Register 10 may, of course, be used in connection with other meter types including polyphase meters. Power and power line communications are provided through the 240 VAC power lines via the meter blades. Register 10 performs metering functions required for residential and commercial applications, e.g., register 10 can measure kilowatthour energy, kilowatt demand and cumulative demand, and record load profile data. Load profile data can also be used to perform time-of-use (TOU) and real time pricing calculations at the utility's billing computer. Register 10 can be used in a remote reading system in which metering data is read electronically via power line communications.

More specifically, register 10 includes a main microprocessor 12 (e.g., a Hitachi H8/3836 processor) and a communications dedicated, or CEBus®, microprocessor 14 (e.g., a Motorola M68HC05 processor). A power supply unit 16 is electrically connected to power lines 18 (e.g., receives 240VAC at 60 Hz) and is coupled to main processor 12 via power fail interrupt and reset lines. Register 10 also includes a non-volatile memory 20 electrically connected to main processor 12 via clock, write and read lines. A master reset edge connector 22, a light emitting diode (LED) 24 for indicating an error condition, a disk sensing optics assembly 26, and an option board interface connector 28 also are connected to main processor 12.

Communications processor 14 is coupled to main processor 12 via data in and data out lines, and communications processor 14 is coupled to power lines 18 via a CEBus interface integrated circuit 30 (including a service control center (SCC) power line controller (PLC)), and a power line interface, or coupling, circuit 32. Coupling circuit 32, as is well known in the art, typically includes a capacitor and transformer. Processor 14 and integrated circuit 30, may, for example, be packaged as a single inline package (SIP) which is commercially available from Intellon, 5100 W. Silver Springs Blvd., Ocala, Fla. 34482 and referred to as the CENODE SIP.

Main processor 12 performs metering, control, monitoring and communication functions. More specifically, main processor 12 contains firmware that performs metering, control and monitoring functions. Main processor 12 also performs upper layer CEBus communications functions. A crystal timebase (not shown) provides timing signals used by main processor 12 for communications and metering functions. Because main processor 12 uses a crystal timebase, it is immune from timekeeping errors that may be caused by large noise sources on power lines.

Power supply unit 16 generates the dc voltages (e.g., 9 VDC and 5 VDC) used by other register components, generates interrupts which indicate that power is failing, and provides reset signals upon power restoration. Non-volatile memory 20 is coupled to main processor 12 as described above for retaining programming and metering data through power outages. A power outage routine, in accordance with aspect of the present invention, is described below in more detail.

Meter reset edge connector 22 is coupled to main processor 12 via transmit and receive data lines and a master reset line. A master reset signal can be transmitted from an external controller, coupled to connector 22, to microprocessor 12 via the master reset line. LED 24 is energized, via ERR LED line, by main processor 12 if an error condition occurs and during initialization.

Disk sensing optics assembly 26 senses meter disk rotation and provides input pulses, via DSK A IN and DSK B IN lines, to main processor 12. More specifically, disk sensing optics assembly 26 includes a six-slotted shutter disk mounted on the meter disk shaft assembly and a sensor assembly (e.g., two light emitting diodes coupled to DSK A IN and DSK B IN, respectively, and two phototransistors coupled to DSK LEDS line) incorporated onto a printed circuit board assembly (not shown). The phototransistors are energized via DSK LEDS line. In the one embodiment, disk sensing optics assembly 26 produces twelve (12) pulses for each complete disk revolution.

Option board interface connector 28 is coupled to main processor 12 via input, set and reset lines. An option board coupled to connector 28 can perform remote disconnect, load control or demand threshold alert functions using the set and reset lines. The option board can also perform, via the input line, tamper detection and other status monitoring.

Communications processor 14 contains firmware that performs lower layer CEBus communication functions. For example, communications processor 14 receives data from main processor and receives data/commands from power lines. Communications processor 14 also filters out messages received on the power lines but not addressed to register and performs some handshaking functions with main processor 12.

Integrated circuit 30 creates and decodes the spread spectrum signals used on the power lines, and generates and checks a 16 bit field for error detection. The power line interface, or coupling, circuit 32 provides the physical interface for signals sent on power lines 18 as well as isolates other register components from the power line voltages.

In one embodiment, components of register 10 are mounted on a printed circuit board and secured within a plastic enclosure (not shown). The printed circuit board provides mounting for all electronic components including master reset edge connector 22 and option board connector 28.

With respect to communicating via power lines 18, and in one embodiment, register 10 uses the EIA IS-60 CEBus communication protocol standard. Common Application Language (CAL) is the application language used by CEBus devices to send and receive information. Addition information regarding the CEBus protocol and CAL is provided in *IS-60 Node Communications Protocol, EIA* 600 Common Application Language Specification Parts 1 *and* 2, Electronic Industries Association, 2001 Pennsylvania Avenue, Washington, D.C. 20006.

Register 10, in one embodiment, supports two modes of communications—polling and automatic reporting. Register 10 can be polled to request any of its metering data. Register 10 also has the capability to automatically send a report message when some unusual condition is detected, which capability is described hereinafter in more detail as the report by exception.

In the one embodiment, register 10 implements the Automatic Meter Reading Association's standard tables and other defined tables. These tables are used for both reading and programming register 10 and are transported using the CAL Utility Context macros defined by the CEBus Industry Council. Additional information regarding the AMRA tables is provided in the *AMA* 4/95-068 *Utility Industry End Device Data Tables*, prepared by the AMRA End Device/TIU working group, available from the National Electric Manufacturers Association, 1300 North 17th Street, Suite 1847, Rosslyn, Va. 22209.

For message security, and in the one embodiment, register 10 executes an authentication and encryption algorithm. Register 10 accommodates three security keys to allow three different levels of read or write access. The different levels of access are used for different utility operations or to allow the utility customers read access to their own meters. Register 10 can also be configured to allow unauthenticated access to selected metering data.

In the one embodiment, register 10 is factory programmed with a unique 18 character serial number. The serial number also is located on a tab just below the meter's mechanical register and is both human and bar code readable. The serial number can be read electronically from register 10 via the CEBus CAL Universal Context Serial Number Instance Variable. A detailed description of the CEBus protocol is set forth in the *EIA/IS-60, EIA Interim Standard, Books* 1 *and* 2, *EIA Home Automation System*, Electronic Industries Association, 2001 Pennsylvania Avenue, Washington, D.C. 20006.

With respect to reading data from register 10, CEBus messages are constructed to read the CAL instance variables and whole or partial tables that contain the necessary meter reading information. To increase reading efficiency, a user defined table can be configured to contain all necessary metering information other than the load profile information. When so configured, normal metering, status and identification information can be obtained with a single table read.

Status information can also be read when reading revenue data so that any unusual conditions can be detected. Any status flags found to be set should be cleared. This is particularly important if a report by exception (RBE) function has been enabled, as the module will continue to periodically report the condition indefinitely until the status is cleared. The RBE function is described below in more detail in connection with the alarm routine aspect of the present invention. A history log is also created in register memory. The history log, as explained below in more detail, retains start and stop times for the last five power outages and can be used to adjust load profile data.

With respect to programming register 10, all information is programmed using either AMRA tables or CEBus instance variables. After initial power up, register 10 must receive a time broadcast in order to initiate any secure communications such as programming messages. A time broadcast may be initiated by a CEBus handheld reader/programmer, a CEBus gateway or a remote system control center via a CEBus gateway. Register 10 normally operates in a fixed system where regular time broadcasts are transmitted by a remote system control center over a wide area network to CEBus gateways which retransmit the time broadcast onto the local CEBus media. Register 10 must also acquire or be given a CEBus address. For system security, a factory default security key is reprogrammed in register 10.

After a power outage, register 10 automatically broadcasts a time request message to alert the system control center that register 10 is again powered up and that a time broadcast is required, as explained below in more detail. Once register 10 has acquired the initial time broadcast, subsequent time broadcasts are subjected to a time tolerance test and rejected if register time does not differ sufficiently from broadcast time. If it is necessary to unconditionally set the register time, this can be accomplished by executing a set time procedure in the AMRA procedures table.

With respect to timekeeping, register 10 maintains date and time in a four byte UNIX standard time format which is minutes since Jan. 1, 1970 @00:00:00 GMT, with a fifth byte containing the current seconds. The current date and time are updated when the broadcast time differs from the register determined time by some programmable tolerance. Time broadcasts are authenticated before updating the time.

With respect to automatic reporting, register 10 automatically reports certain status conditions. Reporting typically consists of sending a CEBus message to a preprogrammed address. The term "Report by Exception", or "RBE", is used to describe this automatic reporting. If a particular RBE status condition has been enabled and the status condition subsequently occurs, a CEBus RBE message is transmitted by register 10. The message is sent to the destination address defined by the CEBus designation address instance variable. The message will be periodically retransmitted indefinitely by register 10 until RBE status flags are reset by some other device, typically a remote system control center. This reporting continues even if the original condition no longer exists. The duration of the retransmit interval is also programmable.

As explained above, register 10 is illustrated and described herein by way of example only and the embodiments of the present invention, as describe below, are not limited to practice in connection with register 10. Specifically, it is contemplated that such embodiments can be incorporated into and used in connection with many other communicating registers. Further, the present invention is not directed to the architecture of register 10 and the many register functions other than the load profile power outage, load profile snapshot and alarm functions described hereinbelow in more detail. In addition, it is contemplated that register 10 would be implemented in a communication system such as the system described in U.S. Pat. No. 5,495,239. Register 10 could, however, be implemented in many other communication systems and the present invention is not limited to practice in any one particular communication system.

Load Profile Power Outage Operation

As explained above, it is highly desirable to eliminate the battery typically used in connection with electronic meter registers which perform load profile recording. The present invention, in one aspect, provides a structure and method of operating a meter register, e.g., register 10, for eliminating the register battery. The following description relates to this aspect of the invention in the context of register 10.

Figure 2:
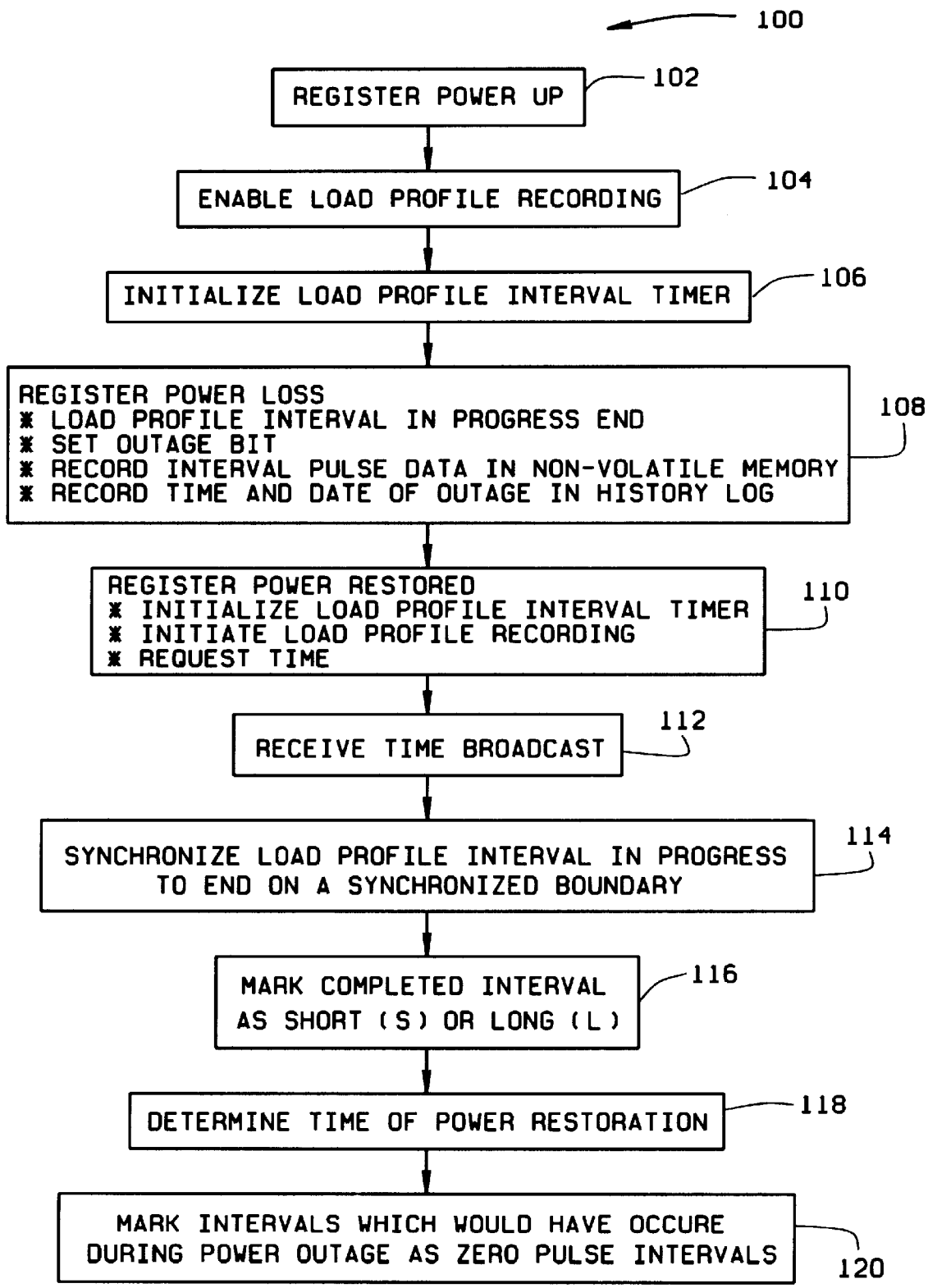
FIG. 2 is a flow chart illustrating a sequence of process steps for executing a load profile recording routine in accordance with one embodiment of the present invention.

Particularly, and referring specifically to FIG. 2 which illustrates a load profile recording routine 100, upon register power up 102, and if load profile recording is enabled 104, a load profile interval timer is initialized 106 to the load profile interval length. With respect to register 10, for example, the register clock maintains time upon initial power-up 102 after the register clock has been set by a time broadcast or an explicit set time command. The register clock keeps accurate time from a crystal time base until power is interrupted. The time information from the register clock is used to determine the end of intervals.

With register 10, load profile interval lengths of 5, 15, 30 and 60 minutes are available. The intervals are synchronized to hour boundaries. Each load profile interval can store up to 15 bits of pulse data for the interval, resulting in a maximum number of pulses recorded of 32767. The input pulses, i.e., the pulse data, are received by main processor 12 from optics assembly 26 and are accumulated and recorded. If, during a load profile interval, the number of pulses exceeds the maximum storage capacity, the value remains frozen at the maximum number of pulses (32767).

The load profile interval data is maintained in non-volatile (nv) random access memory 20 and is therefore unaffected by power outages. Specifically, the load profile data is maintained in 28 memory blocks. Each memory block contains 24 intervals and a four byte end of block time stamp. At the end of each load profile interval, the interval pulse data is recorded in non-volatile memory 20, and the time and date of last recorded interval is updated. If an interval was the last interval in the block, the time and date of last recorded interval is written into non-volatile memory 20 at the end of block.

When register 10 loses power 108, a load profile interval in progress is ended, an outage bit is set, the interval pulse data for the interval in progress is recorded in non-volatile memory 20, and the time and date of the power outage is recorded in the history log. The history log is a circular buffer containing time stamps of the last 5 power outage cycles. If this buffer overruns, the most recent data is preserved. The history log circular buffer is stored in non-volatile memory 20 and must be read in order to translate the load profile data.

Upon power restoration after an outage 110, register timer is again initialized as explained above in connection with step 106. Load profile recording is again initiated. The actual time is unknown to register, however, until register receives the first time broadcast 112 from, for example, the service control center. Upon restoration of power and in one embodiment, register transmits a signal to the service control center informing the center that register is powered up and requires a time broadcast. The service control center then transmits a time broadcast 112 which is received by register.

Upon receipt of the first time broadcast at register 10, the time remaining in the load profile interval is adjusted to force the load profile interval to end on a synchronized boundary 114. This interval is then marked with a time change status indicating whether the interval was a long or short interval 116. Intervals initiated at the end of an outage, i.e., outage intervals, are always short.

When the module receives a time broadcast, the module only updates its time if the broadcast time differs from the module's time by some programmable tolerance. When the module does update its time, the current load profile interval in progress is marked with time change forward or backward and a short or long interval status. For an outage interval, the interval will be marked with a time change forward, and a short or long interval status.

In addition to synchronizing the interval in progress 114 and marking the interval 116 as described above, upon receipt of the initial time broadcast, register determines the time of power restoration 118. This power restoration time is determined by subtracting, from the broadcast time, the amount of time elapsed from restoration of power to receipt of the broadcast time. For example, if the elapsed time from power restoration to broadcast time is five (5) minutes, and if the broadcast time is 1:05 p.m., then the time of power restoration is 1:00 p.m.

After determining the time of power restoration 118, then intervals that would have occurred during the power outage are loaded with zero pulse intervals 120. For example, and continuing from the example above, if the power outage occurred at 12:45 p.m., the intervals between 12:45 p.m. and 1:00 p.m. are loaded with zero pulses.

When desired, the load profile data can be read from non-volatile memory 20 of register 10. All load profile intervals without outage or time change status set represent intervals equal to the load profile interval length. When translating load profile data, the translation system coordinates the power outage and power restoration time stamps with the status bits found in the status bytes of the load profile interval data. Register 10 tracks of the number of power outages and the time and date of the last five outage cycles. Time and date data may not be available if an outage occurs after a previous outage but before a time broadcast can be received by register 10.

When transporting load profile data to the service control center, for example, the interval data is read from memory 20 one block at a time. The data for each interval is stored in two bytes in non-volatile memory 20, and must be transported in three bytes. The additional byte is a status byte for the interval. In order to maximize the capacity of interval data storage, a smaller circular status queue is maintained, which contains the last ten status bytes for the last ten load profile intervals in which a status event occurred. As register 10 sends the load profile interval data, the appropriate status byte is attached to the appropriate interval data. Since the status queue is a finite length, should the load profile data indicate status which had been overwritten, the status byte will reflect the loss of status information.

Operating register 10 in accordance with routine 100 makes it possible to eliminate the battery typically used in connection with electronic meter registers which perform load profile recording. As a result, and with respect to the load profile recording aspect of register 10, the initial cost and maintenance costs of register 10 are reduced and can at least partially offset the cost of the communications components. Further, the costs associated with properly disposing of the register battery at the end of the battery life are eliminated.

Alarm Operation

As explained above, it is highly desirable to offset costs associated with including communication capability in an electronic meter register to provide cost savings and/or productivity gains. The present invention, in one aspect, provides a structure and method of operating a meter register, e.g., register 10, for providing such a cost savings and/or productivity gain when a utility customer relocates. The following description relates to this aspect of the invention in the context of register 10. Of course, the routine described below could be implemented in other communicating registers.

More specifically, a significant percentage of utility customers relocate during the course of one year. When a utility customer relocates, the utility will typically perform a "last read" of the electricity meter when the customer moves out and a "first read" when a new customer moves into the location being metered. During the period of time between when one customer moves out and another customer moves in, the utility must either absorb the loss of any electricity that is used or must disconnect the utility service to prevent energy from being used at the location. Disconnecting and reconnecting the service, however, is typically costly in that such operations usually are performed by a highly skilled utility employee.

Figure 3:
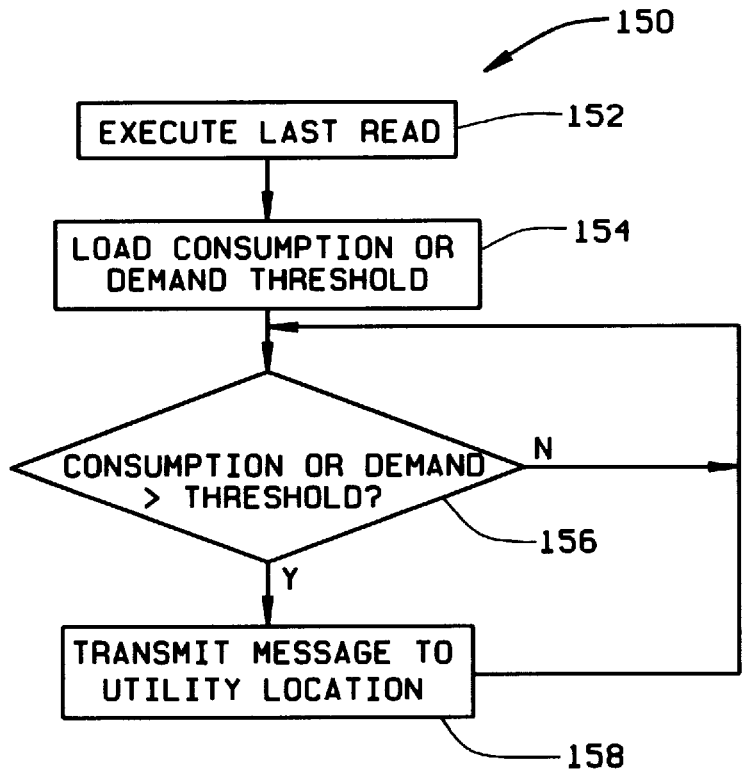
FIG. 3 is a flow chart illustrating a sequence of process steps for executing a consumption or demand threshold alarm routing in accordance with one embodiment of the present invention.

Referring specifically to FIG. 3 in the context of register 10, a routine 150 is described which facilitates reducing costs incurred by the utility when a customer moves from a location being metered. More specifically, when a utility customer moves from a location being metered, a last read 152 of the meter data is performed remotely by reading metering data from register 10 at the service control center. After the last read is executed 152, register 10 is programmed to include a load consumption or demand threshold 156. Register 10 also is programmed to send a report by exception (RBE) message 158 over the network to the service control center if the threshold is exceeded 156.

As an example, for a five dial GE I-70 class 200 meter with a desired demand threshold value of 20 KW and a 15 minute demand interval (4 intervals/hour), the pulse value of the demand threshold is calculated as follows:

$$KW = \frac{\text{pulses} \times K \times \text{demand intervals} / \text{hour}}{1000}$$

$$\text{pulses} = \frac{KW \times 1000}{K \times \text{demand intervals} / \text{hour}}$$

$$\text{pulses} = \frac{20 \times 1000}{0.600 \times 4} = 3000$$

Routine 150 enables a utility to predetermine an energy consumption amount, i.e., the threshold, that it is willing to absorb prior to sending a utility worker to the location being metered. If the threshold is exceeded, then it may be cost effective for the utility to incur the costs associated with disconnecting and reconnecting the service. Rather than simply absorbing the energy costs or disconnecting the services of customers that move, routine 150 enables a utility to more selectively, and cost effectively, determine whether and when a service should be disconnected during the time period of interest, i.e., the time period from when a customer moves out of the location until a new customer moves into the location.

Load Profile Snapshot Operation

Another routine 200 to offset costs associated with including communication capability in an electronic meter register by providing cost savings and/or productivity gains is described below. More specifically, the present invention, in one aspect, provides a structure and method of operating a meter register, e.g., register 10, for ensuring the load control commands are effectively executed by register 10. The following description relates to this aspect of the invention in the context of register 10. Of course, the routine described below could be implemented in other communicating registers.

More specifically, until now, it has been difficult for utilities to evaluate the affects of load control and other demand side management functions on residential customers. For example, load control functions typically are performed using one-way communications and therefore, it is difficult for the utility to verify that the commands were received and that the desired affect was achieved. Tampering, e.g., a customer manually overriding a load control command desired by a utility, also is difficult to detect.

Figure 4:
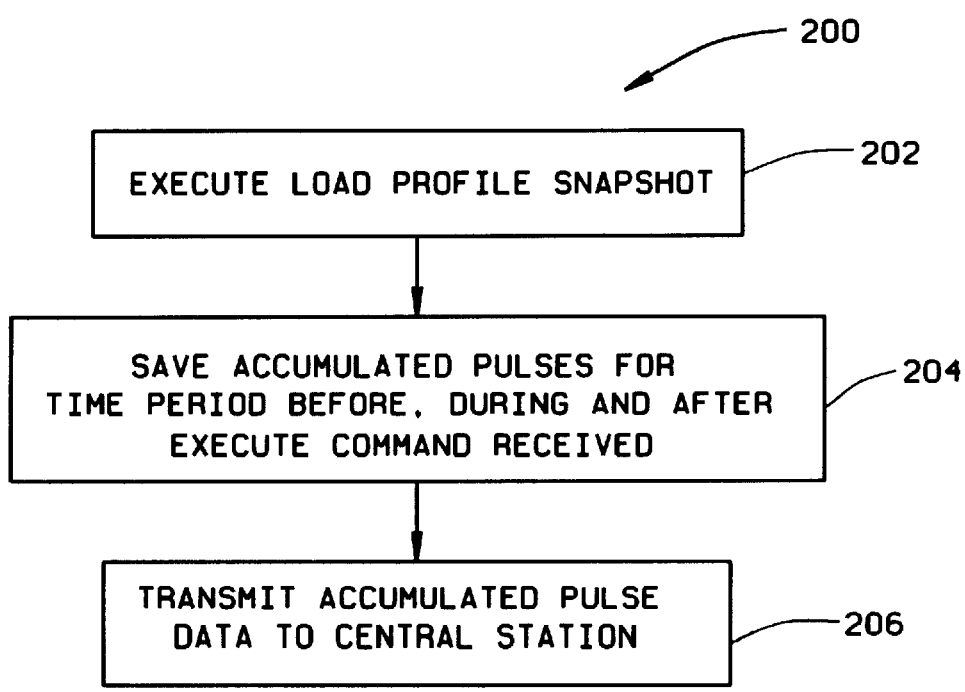
FIG. 4 is a flow chart illustrating a sequence of process steps for executing a load profile snapshot routine in accordance with one embodiment of the present invention.

Referring specifically to FIG. 4 in the context of register 10, a routine 200 is described which facilitates ensuring that the desired affect is achieved when a load control command is to be executed. More specifically, register 10 normally operates so that at the end of every minute, a snap-shot of the pulses collected in the previous minute is taken and stored in a queue for subsequent processing. In addition, and as an aid in evaluating the effect of load control commands and to detect load control tampering, register 10 is programmed to obtain a snapshot of load profile information. Specifically, when a load profile snapshot command is received by register 202, register saves, in memory, the kilowatthour pulses for the minute before, minute during and minute after the command was received 204. The accumulated pulse data is then transmitted 206 by register to the service control center.

When the load profile snapshot command is sent concurrently with a load control command, the cumulative effect of the load control actions can be evaluated. By tracking the effect at individual meters over a period of time, load control tampering also can be detected. In this manner, routine 200 provides a cost savings and/or productivity gains for the utility.

The various embodiment of the invention as described herein include the advantages of eliminating the battery used in known electronic registers without sacrificing load profile metering data integrity, and provide additional cost savings and productivity gains for utilities and others. Although such embodiments have been described in the context of register 10, it should be understood that such embodiments could be implemented in many other communicating registers.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

What is claimed is:

1. A register for coupling to a meter, the meter including an eddy current disk and shaft which rotate in response to the rate of energy consumption by a load being metered thereby, and a shutter mounted to the shaft, said register comprising a microprocessor, a non-volatile memory, and a disk sensing optics assembly, said disk sensing optics assembly configured to generate a predetermined number of pulses for each complete disk revolution, said register further configured to communicate metering data with a service control center, said microprocessor programmed to:

upon register power up, and if load profile recording is enabled, initialize a load profile interval timer to a load profile interval length;

record load profile data in said non-volatile memory when said timer expires; and if said register loses power:
        end a load profile interval in progress;
        set an outage bit;
        record interval pulse data for the interval in progress in said non-volatile memory;
        record the time and date of the power outage in a history log; and
        upon power restoration after an outage, transmit a request for time message from said register.

2. A register in accordance with claim 1 wherein said register further comprises a register clock for maintaining time upon initial power up of said register and after said register has received a time broadcast.

3. A register in accordance with claim 1 wherein the load profile intervals are synchronized to hour boundaries.

4. A register in accordance with claim 1 wherein the load profile data is maintained in memory blocks designated in said non-volatile memory, and said register is further programmed to record a block time and date stamp in each of said blocks corresponding to a time and date when a last recorded interval is written into said non-volatile memory block.

5. A register in accordance with claim 1 wherein said history log comprises a circular buffer containing time stamps of power outages and power returns.

6. A register in accordance with claim 1 wherein said microprocessor is further programmed to:

upon power restoration after an outage, initialize said register timer;

initiate load profile recording;

receive a time broadcast from the service control center; and upon receipt of a first time broadcast from the service control center after power up, force the load profile interval in progress to end on a synchronized boundary.

7. A register in accordance with claim 6 wherein said microprocessor is further programmed to, upon completion of the interval in progress, mark the interval with a time change status indicating that the interval was short.

8. A register in accordance with claim 6 wherein said microprocessor is further programmed to:

determine the time of power restoration; and mark intervals that would have occurred during the power outage as zero pulse intervals.

9. A register for use in connection with a meter for metering energy consumed by a load, said register configured to determine energy consumed by the load based on data obtained from the meter, said register further configured to communicate with a service control center, said register comprising a microprocessor and a memory, said microprocessor operable to:

transmit metering data from said register memory to the service control center;

compare energy consumed by the load with a threshold if a threshold alarm is enabled; and transmit a message to the service control center if the energy consumed exceeds the threshold.

10. A register in accordance with claim 9 wherein said threshold is based on a preselected demand measurement of energy consumption.

11. A register in accordance with claim 9 wherein said register is coupled for communicating on power lines for supplying energy to the load being metered.

12. A register for coupling to a meter, the meter including an eddy current disk and shaft which rotate in response to the rate of energy consumption by a load being metered thereby, and a shutter mounted to the shaft, said register comprising a microprocessor, a memory, and a disk sensing optics assembly, said disk sensing optics assembly configured to generate a predetermined number of pulses for each complete disk revolution, said register further configured to communicate metering data with a service control center, said microprocessor programmed to:

receive a load profile snapshot command;

save accumulated pulses for a time period before, a time period during, and a time period after receiving the load profile snapshot command; and transmit thus-saved load profile snapshot data to the service control center.

13. A register in accordance with claim 12 wherein the time periods each equal approximately about one minute.

14. A method for storing load profile data in a meter including a register comprising a microprocessor and a non-volatile memory, the register configured to receive data representative of energy consumed by a load being metered thereby, the register further configured to communicate metering data to a service control center, said method comprising the steps of:

upon register power up, initializing a register load profile interval timer to a load profile interval length;

recording interval load profile data in the non-volatile memory when the timer expires; and if said register loses power:
        ending a load profile interval in progress;
        setting an outage bit;
        recording interval pulse data for the interval in progress in the non-volatile memory;
        recording the time and date of the power outage in a history log; and
        upon power restoration after an outage, transmitting a request for time message from the register.

15. A method in accordance with claim 14 wherein the load profile intervals are synchronized to hour boundaries.

16. A method in accordance with claim 14 wherein the load profile data is maintained in memory blocks designated in the non-volatile memory, and said method further comprises the step of recording a block time and date stamp in each of the blocks corresponding to a time and date when a last recorded interval is written into the non-volatile memory block.

17. A method in accordance with claim 14 further comprising the steps of:

upon power restoration after an outage, initializing the register timer;

initiating load profile recording;

receiving a time broadcast from the external control unit; and upon receipt of a first time broadcast from the service control center after power up, forcing the load profile interval in progress to end on a synchronized boundary.

18. A method in accordance with claim 17 further comprising the step of, upon completion of the interval in progress, marking the interval with a time change status indicating a length of the interval.

19. A method in accordance with claim 17 further comprising the steps of:

determining the time of power restoration; and marking intervals that would have occurred during the power outage as zero pulse intervals.

20. A method for monitoring an electric service using a meter including a register comprising a microprocessor and a memory, the register configured to receive data representative of energy consumed by a load being metered thereby, the register further configured to communicate metering data to a service control center, said method comprising the steps of:

transmitting metering data from the register memory to the service control center;

comparing energy consumed by the load with a threshold if a threshold alarm is enabled; and transmitting a message to the service control center if the energy consumed exceeds the threshold.

21. A method in accordance with claim 20 wherein the threshold is based on a preselected demand measurement of energy consumption.

22. A method for monitoring an electric service using a meter including a register comprising a microprocessor and a non-volatile memory, the register configured to receive data representative of energy consumed by a load being metered thereby, the register further configured to communicate metering data with a service control center, said method comprising the steps of:

receiving a load profile snapshot command;

saving accumulated pulses for a time period before, a time period during, and a time period after receiving the load profile snapshot command; and transmitting thus-saved load profile snapshot data to the service control center.

23. A method in accordance with claim 22 wherein the time periods each equal approximately about one minute.

* * * * *